United States Patent
Rong et al.

(10) Patent No.: US 8,588,570 B2
(45) Date of Patent: Nov. 19, 2013

(54) TWO-PHOTON-ABSORPTION-BASED SILICON WAVEGUIDE PHOTO-POWER MONITOR

(75) Inventors: Haisheng Rong, Pleasanton, CA (US); I-Wei Andy Hsieh, Santa Clara, CA (US); Mario J. Paniccia, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 277 days.

(21) Appl. No.: 12/895,578

(22) Filed: Sep. 30, 2010

(65) Prior Publication Data
US 2012/0080672 A1 Apr. 5, 2012

(51) Int. Cl.
*G02B 6/12* (2006.01)

(52) U.S. Cl.
USPC .............................. 385/132; 385/14

(58) Field of Classification Search
USPC .................................... 385/132, 14
See application file for complete search history.

(56) References Cited

U.S. PATENT DOCUMENTS

| | | | |
|---|---|---|---|
| 5,625,729 A * | 4/1997 | Brown | 385/31 |
| 6,577,399 B1 | 6/2003 | Bergmann et al. | |
| 7,162,113 B2 | 1/2007 | Welch et al. | |
| 7,266,258 B2 * | 9/2007 | Liu et al. | 385/8 |
| 7,453,132 B1 * | 11/2008 | Gunn et al. | 257/448 |
| 7,616,904 B1 * | 11/2009 | Gunn et al. | 398/214 |
| 7,840,098 B2 * | 11/2010 | Rong | 385/1 |
| 8,242,432 B2 * | 8/2012 | Feng et al. | 250/227.11 |
| 2005/0265679 A1 * | 12/2005 | Liu et al. | 385/131 |
| 2006/0093369 A1 | 5/2006 | Nagarajan | |
| 2006/0159382 A1 * | 7/2006 | Rong | 385/1 |
| 2010/0200781 A1 * | 8/2010 | Khorasani et al. | 250/576 |
| 2011/0315988 A1 * | 12/2011 | Yu et al. | 257/52 |

FOREIGN PATENT DOCUMENTS

| | | |
|---|---|---|
| WO | 2012/044618 A2 | 4/2012 |
| WO | 2012/044618 A3 | 7/2012 |

OTHER PUBLICATIONS

International Search Report and Written Opinion for PCT Patent Application No. PCT/US2011/053470, mailed on May 4, 2012, 15 pages.
International Preliminary Report on Patentability for International Application No. PCT/US2011/053470, mailed on Apr. 11, 2013.

* cited by examiner

*Primary Examiner* — Kaveh Kianni
(74) *Attorney, Agent, or Firm* — Kevin A. Reif

(57) ABSTRACT

Instead of monitoring the optical power coming out of a waveguide, a direct method of monitoring the optical power inside the waveguide without affecting device or system performance is provided. A waveguide comprises a p-i-n structure which induces a TPA-generated current and may be enhanced with reverse biasing the diode. The TPA current may be measured directly by probing metal contacts provided on the top surface of the waveguide, and may enable wafer-level testing. The p-i-n structures may be implemented at desired points throughout an integrated network, and thus allows probing of different devices for in-situ power monitor and failure analysis.

5 Claims, 4 Drawing Sheets

TWO-PHOTON-ABSORPTION-BASED SILICON WAVEGUIDE PHOTO-POWER MONITOR

FIELD OF THE INVENTION

Embodiments of the present invention are directed to optical power monitoring and, more particularly, to in-situ optical power monitoring in a silicon waveguide.

BACKGROUND INFORMATION

High-bandwidth, power efficient, and reliable optical links have potential to change the consumer electronics and server markets as Internet data traffic continues to grow exponentially over the years and electronic interconnects are reaching their limits to sustain such growth. Integrated optoelectronic technology can serve as critical enabler to allow personal computing devices to send and receive data at unprecedented rate. In recent years, many successes in optical-component research in the field of silicon photonics have made silicon-on-insulator (SOI) the most promising material-platform-of-choice for the future generations of integrated optoelectronic systems. A typical integrated optoelectronic system could include lasers, modulators, multiplexers/demultiplexers, photo-detectors, and other passive components such as filters and couplers.

Lasers are well known devices that emit light through stimulated emission and produce coherent light beams with a frequency spectrum ranging from infrared to ultraviolet and may be used in a vast array of applications. In an integrated photonic link, data is encoded from a laser source through a modulator and propagates through waveguides. In many applications, the optical data travels through several active and passive components on the same chip, and it is desirable to monitor the optical power at various stages of the system.

Currently, one standard way to monitor optical power inside a waveguide is to collect the light exiting the waveguide with an optical fiber or free-space objective. The optical power may be measured with an external power-meter. The actual power may be determined by assuming some pre-characterized losses, including input/output coupling losses and waveguide propagation loss.

All these loss characterizations are carefully measured and calibrated beforehand. For instance, propagation loss is usually measured via on-chip cutback method, which requires making several bend waveguides with various lengths on the same chip. One would measure the output power from each bended waveguide, and determine the propagation loss via a statistical fit.

The method described above would occupy precious wafer areas, and may only work with simple waveguide structures on a component-level. In an integrated photonic network setting, where many optical components are linked together on the same substrate, the above-mentioned method may not work well. For instance, in the case of a network failure, it is important to find the failing component in the integrated network. Since the above method only determines whether the network is failing, but not where the network is failing, an alternative power monitor scheme is desired.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is a method and apparatus for in-situ optical power monitoring. In recent years silicon photonic components such as lasers, modulators, photo-detectors, wavelength converters, and wavelength multiplexers/demultiplexers have been developed. When integrating all these individual components onto a single silicon-based platform, it is desirable to be able to monitor the optical power of the integrated system at the chip-level. That is, the ability to monitor optical power at any desired point on chip is needed. Thus, in-situ power monitors would be useful in identifying and isolating the faulty component in a system without affecting the performance of a system.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
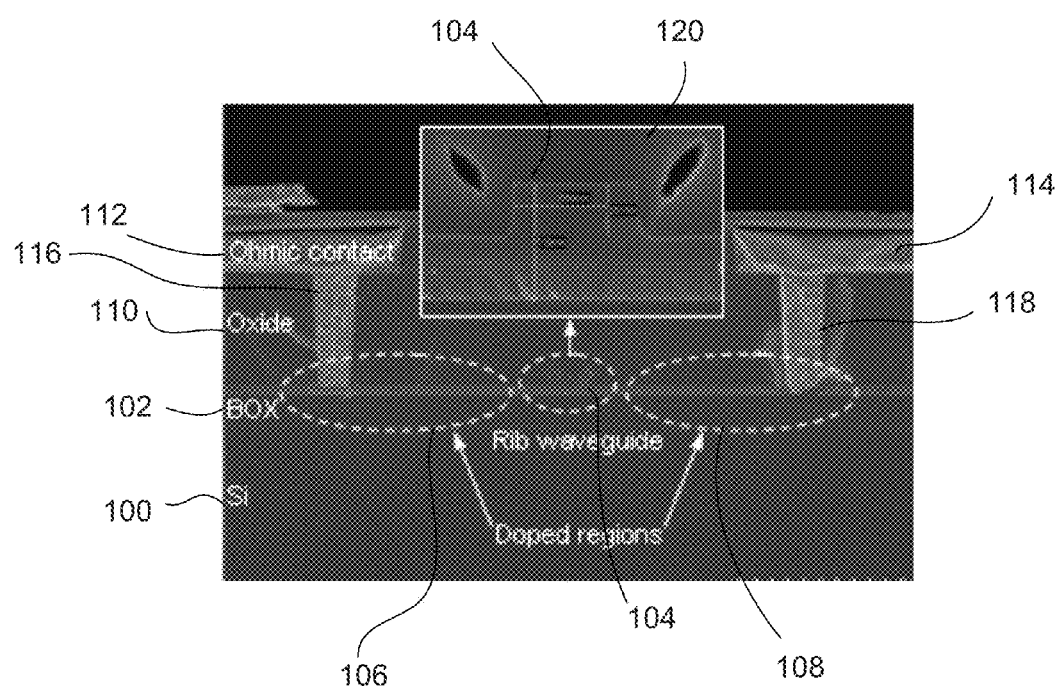
FIG. 1 is a scanning electron microscope image of a p-i-n waveguide cross-section according to one embodiment.

Referring to FIG. 1, there is shown a scanning electron microscope image of a p-i-n waveguide cross-section. Embodiments of the invention utilize a nonlinear optical effect, namely Two-Photon-Absorption (TPA), in a silicon waveguide to allow a direct probing of the optical power inside the waveguide. As shown, a silicon substrate 100 may have formed thereon a buried oxide layer (BOX) 102 and a rib waveguide 104. A p-doped region 106 and an n-doped region 108 may be located on either side of the rib waveguide 104. An oxide layer 110 may be formed over the structure as passivation layer. Ohmic contacts, 112 and 114, may be formed on the oxide layer 110 to make electrical contact with p-doped region 106 and the n-doped region 108, with vias 116 and 118, respectively. The inset box 120 shows and enlarged view of the rib waveguide 104.

Figure 2A:
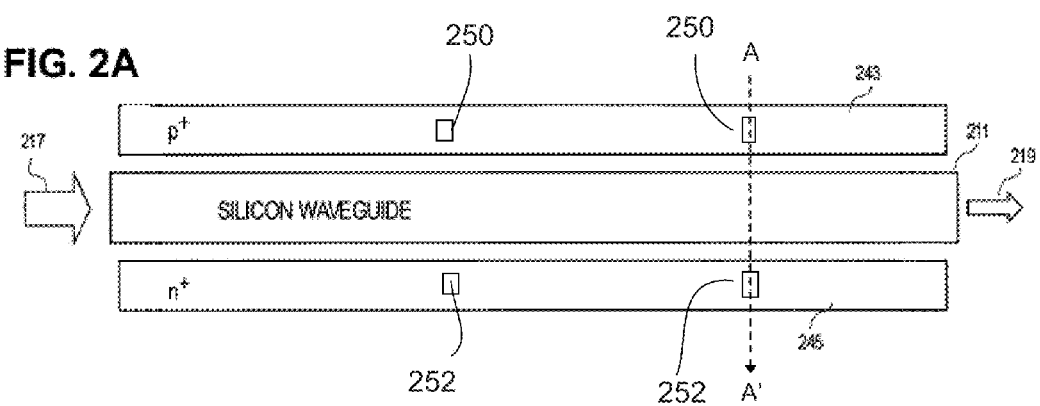
FIG. 2A is a block diagram comprising a top view of the p-i-n waveguide such as that shown in FIG. 1.
Figure 2B:
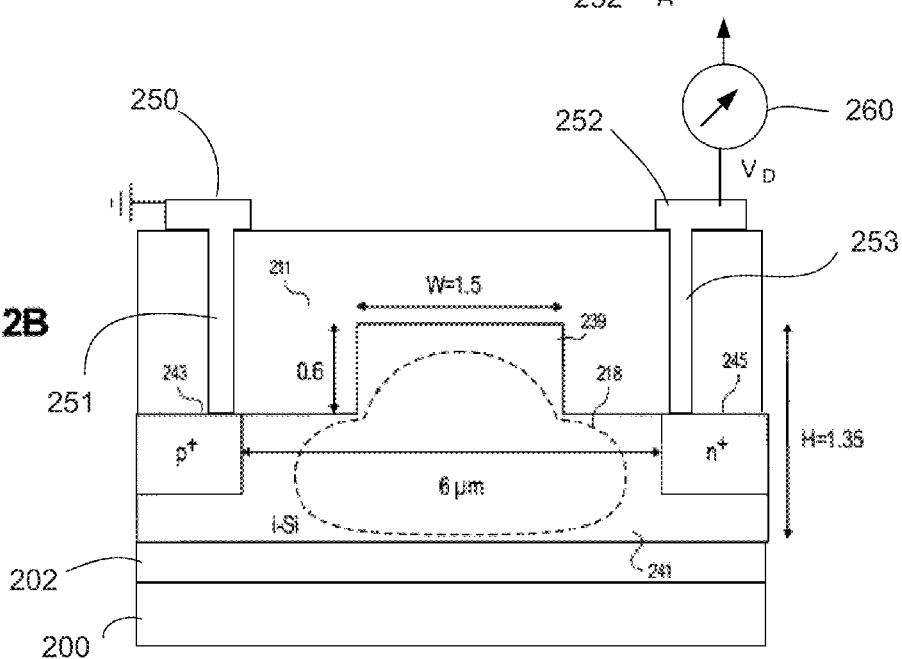
FIG. 2B is a cross-sectional view of the p-i-n waveguide taken along line A-A' of FIG. 2A.

Referring to FIGS. 2A and 2B simultaneously, there is shown block diagrams to better illustrate a p-i-n waveguide such as that shown in FIG. 1. FIG. 2A shows a top view of an optical waveguide 211 in accordance with the teachings of the present invention and FIG. 2B shows one embodiment of a cross-section view of optical waveguide 211 taken along cross-sectional line A-A' of FIG. 2A. The waveguide 211 may be formed on a silicon on insulator (SOI) platform comprising a silicon substrate 200 and a buried oxide (BOX) layer 202. An optical beam 217 may travel through a first section of the waveguide 211 and the optical beam 219 may continue through a second portion of the waveguide 211.

The waveguide 211 may comprise a rib region 239 and a slab region 241. In one embodiment, the semiconductor material of waveguide 211 includes intrinsic silicon with a p+ doped region 243 and an n+ doped region 245 disposed on opposite lateral sides of slab region 241 outside an optical path or optical mode 218 through waveguide 211. In one embodiment, p+ doped region 243 is coupled to ground and n+ doped region 245 is coupled to $V_D$ such that the resulting P-I-N diode structure is adapted to be reverse biased in accordance with the teachings of the present invention. In one embodiment the dopant concentrations may be in the order of $10^{17}$ to $10^{18}$ 1/cm$^3$, with boron as p-type dopant and phosphorus as n-type dopant. Of course, the types dopants and concentrations are not limited thereto.

In one embodiment, rib region 239 of waveguide 211 has a width W=0.6 um, waveguide 211 has a height H=0.5 um, and an etch depth of 0.22 um. As shown in the depicted embodiment, there is a separation between p+ doped region 243 and n+ doped region 245 of 2.4 um. In one embodiment, p+ doped region 243 and an n+ doped region 245 with the separation of 2.4 μm gives almost no additional optical loss in accordance with the teachings of the present invention. A plurality of ohmic contacts 250 may be formed over the top surface of the waveguide 211 which connects to the P-doped region 243 with a vias 251. Likewise a plurality of ohmic contacts 252 may be formed over the top surface of the waveguide 211 which connects to the N-doped region 245 with a vias 253. The ohmic contact 250 and 252 may be formed at any desired point along the length of the waveguide 211 to create probing points to enable the in-situ determination of the optical power traveling in the waveguide 211 at that point by reverse biasing the p-i-n structure and measuring the TPA-induced current.

When photons propagate inside the waveguide 211, an electron-hole pair is generated for every two photons absorbed, and current may be generated. In the passive scheme, the TPA-induced current will recombine at the waveguide surface. In the present p-i-n waveguide scheme, an intrinsic electric field sweeps the TPA-induced current across the waveguide 211, and thus could be detected with an ammeter probe 260. During the process, some TPA-induced current will still recombine at the waveguide surface with the intrinsic electric field of the p-i-n diode. By applying more reverse-bias to the diode, one can create an even stronger electric field to collect more TPA-induced current and therefore enhance the effect. Since the current is generated by the photons, not by reverse-biasing the diode, it is possible to monitor the optical power without changing the original optical response of the waveguide.

TPA is understood to be a nonlinear process, meaning the free-carrier density, N(z), is related to the input peak power, P(z), as:

$$N(z) = \frac{\beta \lambda_p \tau_{eff}}{2hc} \frac{P^2(z)}{A_{eff}^2},$$

where β is TPA-absorption coefficient, $\lambda_p$ is the wavelength of the optical wave, $\tau_{eff}$ is the effective free-carrier lifetime, hc is the photon energy, and $A_{eff}$ is the effective area of the waveguide. U.S. Pat. No. 7,266,258, commonly assigned, offers a more detailed discussion of TPA and possible waveguide structures which may be suitable for implementing the present invention and is herein incorporated by reference.

Figure 3:
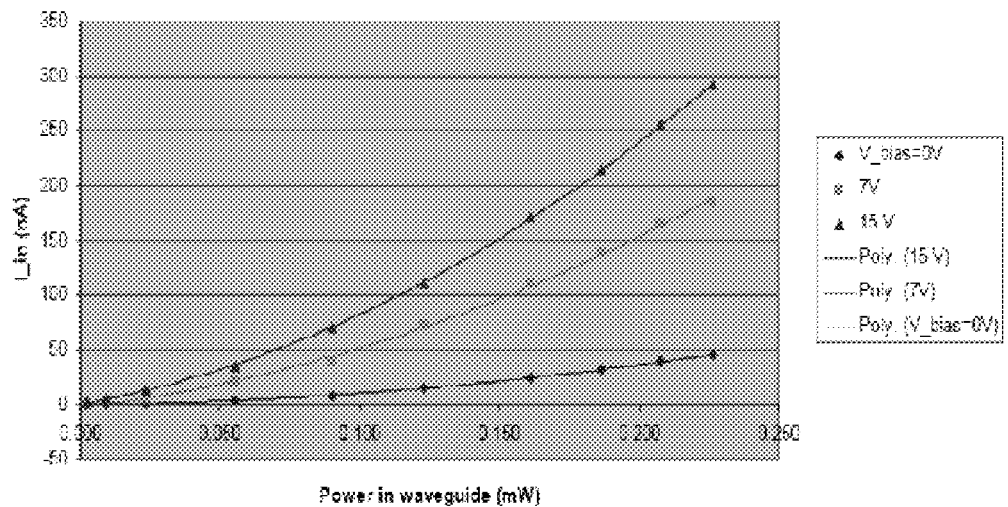
FIG. 3 is a graph illustrating the optical power inside the waveguide versus the measured two-photon absorption (TPA)-generated current.

Referring now to FIG. 3, there is shown a graph illustrating the optical power inside the waveguide versus the measured two-photon absorption (TPA)-generated current and demonstrates the quadratic relationship between optical power and TPA-current. As shown, the different curves correspond to various reverse-bias conditions of the p-i-n diode. In this experiment the curves represent reverse bias voltages for 0 V, 7V and 15V. The quadratic fits to the measured data show that there is a square power-dependence between optical power and measured electrical current, which is a signature of TPA. For a given optical power, an increase in responsivity of the power monitor by 6-folds by applying a reverse bias voltage of 15V is observed.

Figure 4:
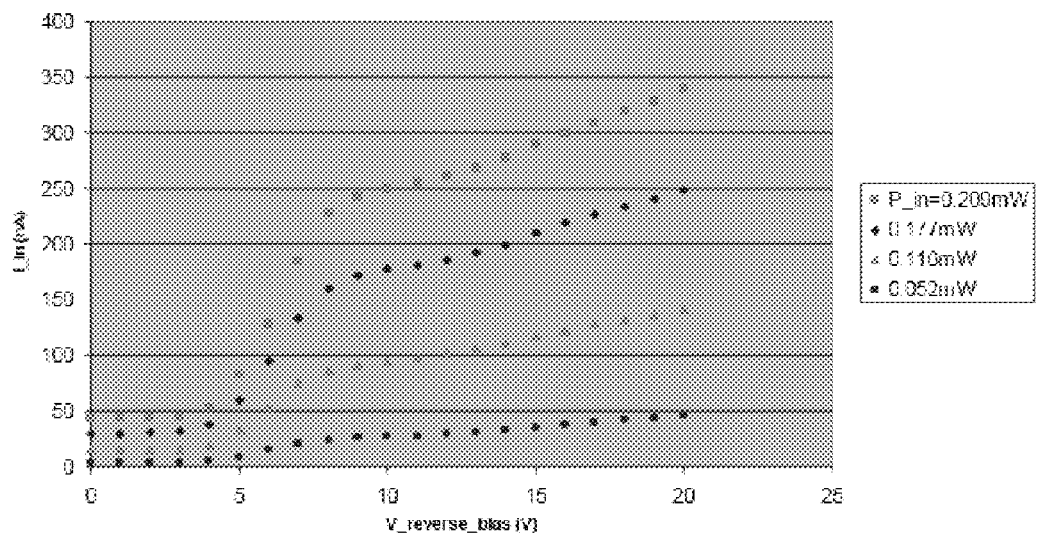
FIG. 4 is a graph illustrating reverse-biased voltage applied to the waveguide p-i-n diode versus the measured TPA-generated current.

Referring now to FIG. 4, there is shown a graph illustrating reverse-biased voltage applied to the waveguide p-i-n diode versus the measured TPA-generated current. The different curves correspond to various input optical power inside the waveguide. In this graph the optical powers of 0.209 mW, 0.177 mW, 0.116 mW, and 0.052 mW are shown. By increasing the reverse-bias voltage, it is shown that responsivity of the p-i-n power monitor is improved by about a factor of six at 15V. Thus, it is possible to measure optical power as little as 0.05 mW (−13 dBm), which is sensitive enough for typical on-chip optical interconnects.

Figure 5:
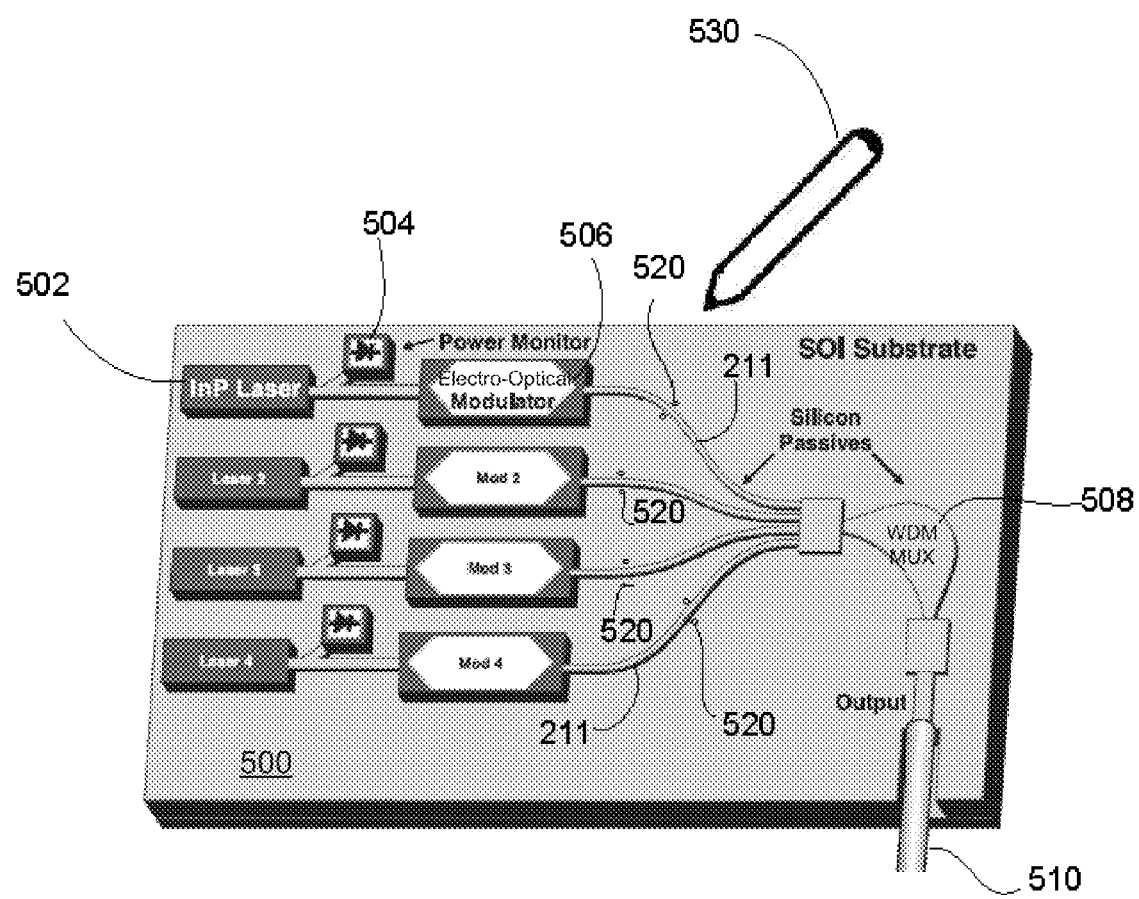
FIG. 5 is a block diagram illustrating a integrated photonic network which may be probed to determine optical power in-situ at any point in a waveguide.

FIG. 5 is a block diagram illustrating an integrated photonic network which may be probed to determine optical power in-situ at any point in a waveguide according to one embodiment. The network may be formed on a SOI substrate 500 and may include any number and type of devices. In this example, the network may include one or more lasers 502, conventional power monitors 504, modulators 506, WDM multiplexers (MUX) 508, connected optical fibers, and a network of various p-i-n waveguides 211, according to embodiments of the present invention.

Probe points 520 (which may correspond to ohmic contacts 250 and 252 discussed in reference to FIGS. 2A and 2B) may be placed a plurality of locations anywhere along the p-i-n waveguides 211. These probe points 520 may be reversed biased and a probe device 530, which includes an ammeter, may be used to detect the TPA-induced current at that point to thus determine the optical power inside the waveguide at that point. This may be useful, for among other reasons, to determine the health or failure of nearby components in the network.

As discussed above, embodiments comprise implanting selected regions of one side of the waveguide with p-type dopants and the other side with n-type dopants. Upon activating the dopants and depositing metal contacts, p-i-n structures are formed. Embodiments incorporate p-i-n structures in the waveguide, which is not present in current passive waveguide devices. This allows probing the TPA-generated current wherever the p-i-n contacts are present. This method is advantageous to conventional power monitoring solutions since the p-i-n structures can be placed anywhere along the waveguide, the optical power may be probed and monitored along multiple parts of the waveguide from the top surface of the sample, instead of monitoring the optical output from the end facet.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
    a waveguide formed on a silicon-on-insulator (SOI) substrate;
    a p-doped region on a first side of the waveguide;
    an n-doped region on an opposite side of the waveguide, wherein when the p-doped region and the n-doped region are reversed biased optical power in the waveguide is monitored by measuring a two-photon absorption (TPA) generated current;
    a plurality of probe contact pairs on the top surface of the substrate straddling the waveguide, one of the probe contacts in each pair electrically connected to the p-doped region and the other of the probe contacts in each pair electrically connected to the n-doped region, the probe contact pairs being positioned at any point along the waveguide to enable the in-situ determination of the optical power traveling in the waveguide at that point.

2. The apparatus as recited in claim 1, wherein the electrical Probe contacts are to be probed with ammeter.

3. The apparatus as recited in claim 1 wherein the waveguide comprises a rib waveguide.

4. The apparatus as recited in claim 1 wherein dopant concentrations are in the order of $10^{17}$ to $10^{18}$ 1/cm$^3$, with boron as p-type dopant and phosphorus as n-type dopant.

5. The apparatus as recited in claim 1 wherein the SOI substrate comprises a plurality of active and passive components.

* * * * *

UNITED STATES PATENT AND TRADEMARK OFFICE
CERTIFICATE OF CORRECTION

| | | |
|---|---|---|
| PATENT NO. | : 8,588,570 B2 | Page 1 of 1 |
| APPLICATION NO. | : 12/895578 | |
| DATED | : November 19, 2013 | |
| INVENTOR(S) | : Haisheng Rong et al. | |

It is certified that error appears in the above-identified patent and that said Letters Patent is hereby corrected as shown below:

Please insert:

In column 1, line 4, before FIELD OF THE INVENTION,

-- STATEMENT OF GOVERNMENT INTEREST

This invention was made with Government support under contract number H98230-08-3-0011 awarded by the Department of Defense. The Government has certain rights in this invention.--

Signed and Sealed this
Fifth Day of April, 2016

Michelle K. Lee
*Director of the United States Patent and Trademark Office*